US 11,051,405 B2

(12) United States Patent
Hwu et al.

(10) Patent No.: US 11,051,405 B2
(45) Date of Patent: Jun. 29, 2021

(54) FLEXIBLE DISPLAY

(71) Applicant: Au Optronics Corporation, Hsinchu (TW)

(72) Inventors: Keh-Long Hwu, Hsinchu County (TW); Yung-Chih Chen, Taichung (TW); Tsung-Ying Ke, Tainan (TW); Wan-Tsang Wang, Hsinchu (TW); Chun-Hsin Liu, Yunlin County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/792,849

(22) Filed: Feb. 17, 2020

(65) Prior Publication Data

US 2020/0359499 A1  Nov. 12, 2020

(30) Foreign Application Priority Data

May 7, 2019 (TW) .................................. 108115697

(51) Int. Cl.
| H05K 1/00 | (2006.01) |
| H05K 1/14 | (2006.01) |
| H01L 27/32 | (2006.01) |
| H01L 51/00 | (2006.01) |
| H05K 1/02 | (2006.01) |

(52) U.S. Cl.
CPC ......... *H05K 1/147* (2013.01); *H01L 27/3276* (2013.01); *H01L 51/0097* (2013.01); *H05K 1/028* (2013.01); *H01L 2251/5338* (2013.01); *H05K 2201/10128* (2013.01)

(58) Field of Classification Search
USPC ....................................................... 361/749
See application file for complete search history.

(56) References Cited

U.S. PATENT DOCUMENTS

| 9,773,855 | B2 | 9/2017 | Wu |
| 10,359,656 | B2 | 7/2019 | Wang et al. |
| 10,429,681 | B1 | 10/2019 | Wang et al. |
| 2014/0375916 | A1* | 12/2014 | Chen .................. H01L 27/1218 349/33 |

(Continued)

FOREIGN PATENT DOCUMENTS

| CN | 104916252 | 9/2015 |
| CN | 106384740 | 2/2017 |

(Continued)

*Primary Examiner* — Andargie M Aychillhum
(74) *Attorney, Agent, or Firm* — JCIPRNET

(57) ABSTRACT

A flexible display including a buffer layer, a plurality of pixel structures, a plurality of first pads, a plurality of first conductive through holes, a flexible circuit board and an adhesive layer is provided. The pixel structures are disposed on a first surface of the buffer layer. The first pads are disposed on a second surface of the buffer layer. The first conductive through holes are embedded in the buffer layer. The first pads are respectively electrically connected to the pixel structures through the first conductive through holes. The adhesive layer is disposed between the second surface of the buffer layer and the flexible circuit board. An orthogonal projection of the adhesive layer on the buffer layer overlaps an orthogonal projection of the pixel structures on the buffer layer. The first pads are electrically connected to first signal lines of the flexible circuit board.

11 Claims, 8 Drawing Sheets

(56) References Cited

U.S. PATENT DOCUMENTS

| | | | |
|---|---|---|---|
| 2017/0148864 A1 | 5/2017 | Wu | |
| 2018/0210265 A1 | 7/2018 | Wang et al. | |
| 2019/0252481 A1* | 8/2019 | Kim | H01L 27/3276 |
| 2019/0285932 A1 | 9/2019 | Wang et al. | |

FOREIGN PATENT DOCUMENTS

| | | |
|---|---|---|
| CN | 106773384 | 5/2017 |
| CN | 107093558 | 8/2017 |

* cited by examiner

FLEXIBLE DISPLAY

CROSS-REFERENCE TO RELATED APPLICATION

This application claims the priority benefit of Taiwan application serial no. 108115697, filed on May 7, 2019. The entirety of the above-mentioned patent application is hereby incorporated by reference herein and made a part of this specification.

BACKGROUND

Technical Field

The disclosure relates to a display, and more particularly to a flexible display.

Description of Related Art

With the development of display technology, the application range of display panels increasingly widens. For example, in the early days, the display panels were mostly used as the screens of electronic devices (such as televisions, computers, mobile phones, etc.), and the display panels applied to the electronic devices were mostly rigid display panels. Recently, some people have applied display panels to wearable devices (such as watches, clothes, etc.), and the display panels applied to the wearable devices are mostly flexible display panels.

Flexible display panels need to have considerable bendability. In other words, when the flexible display panel is bent, members on the flexible substrate (such as thin film transistors, data lines, scan lines, peripheral wirings, etc.) need to be bent accordingly and maintain normal functions. At present, the more common flexible display panels are formed by stacking components (such as conductive film layers and insulating layers) by a thin film process. However, when the flexible display panel is bent, part of the film layers are easily broken due to poor stress tolerance, which in turn leads to failure of the flexible display panel.

SUMMARY

The disclosure provides a flexible display which has good bending tolerance.

A flexible display of the disclosure includes a buffer layer, a plurality of pixel structures, a plurality of first pads, a plurality of first conductive through holes, a flexible circuit board and an adhesive layer. The buffer layer has a first surface and a second surface opposite to each other. The pixel structures are disposed on the first surface of the buffer layer. The first pads are disposed on the second surface of the buffer layer and spaced from each other. The first conductive through holes are embedded in the buffer layer. The first pads are respectively electrically connected to the pixel structures through the first conductive through holes. The flexible circuit board has a plurality of first signal lines. The adhesive layer is disposed between the second surface of the buffer layer and the flexible circuit board. An orthogonal projection of the adhesive layer on the buffer layer overlaps an orthogonal projection of the pixel structures on the buffer layer. The first pads are electrically connected to the first signal lines of the flexible circuit board.

In an embodiment of the disclosure, the adhesive layer of the flexible display is an anisotropic conductive adhesive.

The first pads are electrically connected to the first signal lines of the flexible circuit board through the adhesive layer.

In an embodiment of the disclosure, the flexible display further includes a plurality of second conductive through holes embedded in the adhesive layer. The first pads are respectively electrically connected to the first signal lines of the flexible circuit board through the second conductive through holes.

In an embodiment of the disclosure, the flexible display further has a plurality of second signal lines disposed intersecting with the first signal lines. The second signal lines are electrically connected to the pixel structures. The first signal lines and the second signal lines of the flexible circuit board define a plurality of pixel areas. The pixel structures are respectively disposed in the pixel areas.

In an embodiment of the disclosure, the flexible circuit board of the flexible display further has a flexible substrate. The first signal lines and the second signal lines are respectively disposed on opposite sides of the flexible substrate.

In an embodiment of the disclosure, the adhesive layer of the flexible display has a plurality of first grooves. An orthogonal projection of each of the first grooves is located between two orthogonal projections of any two adjacent first pads among the first pads.

In an embodiment of the disclosure, the adhesive layer of the flexible display further has a plurality of second grooves intersecting with the first grooves. The first grooves and the second grooves define a plurality of island-shaped blocks of the adhesive layer. The pixel structures are respectively disposed above the island-shaped blocks of the adhesive layer.

In an embodiment of the disclosure, the flexible display further has a protective layer. The flexible circuit board is located between the adhesive layer and the protective layer. The protective layer has a plurality of third grooves. An orthogonal projection of each of the third grooves is located between two orthogonal projections of any two adjacent first pads among the first pads.

In an embodiment of the disclosure, the protective layer of the flexible display further has a plurality of fourth grooves intersecting with the third grooves. The third grooves and the fourth grooves define a plurality of bumps of the protective layer. The pixel structures are respectively disposed above the bumps of the protective layer.

In an embodiment of the disclosure, the ductility of one of the first signal lines of the flexible circuit board of the flexible display is higher than the ductility of a conductive pattern of one of the pixel structures.

In an embodiment of the disclosure, the consistency of one of the first signal lines of the flexible circuit board of the flexible display is greater than the consistency of a conductive pattern of one of the pixel structures.

Based on the above, when the flexible display according to an embodiment of the disclosure is bent, the adhesive layer connected between the flexible circuit board and the buffer layer provided with the pixel structures receives most of the bending stress, which can reduce the risk of breakage of adjacent film layers under the tensile stress or the crushing stress and can help improving the bending tolerance of the flexible display. Further, the first signal lines for driving the pixel structures are disposed on the flexible circuit board, which can increase the tensile strain of the first signal lines, thereby ensuring the electrical performance of the pixel structures when the flexible display is bent.

In order to make the aforementioned features and advantages of the disclosure comprehensible, embodiments accompanied with drawings are described in detail below.

DESCRIPTION OF THE EMBODIMENTS

Figure 1:
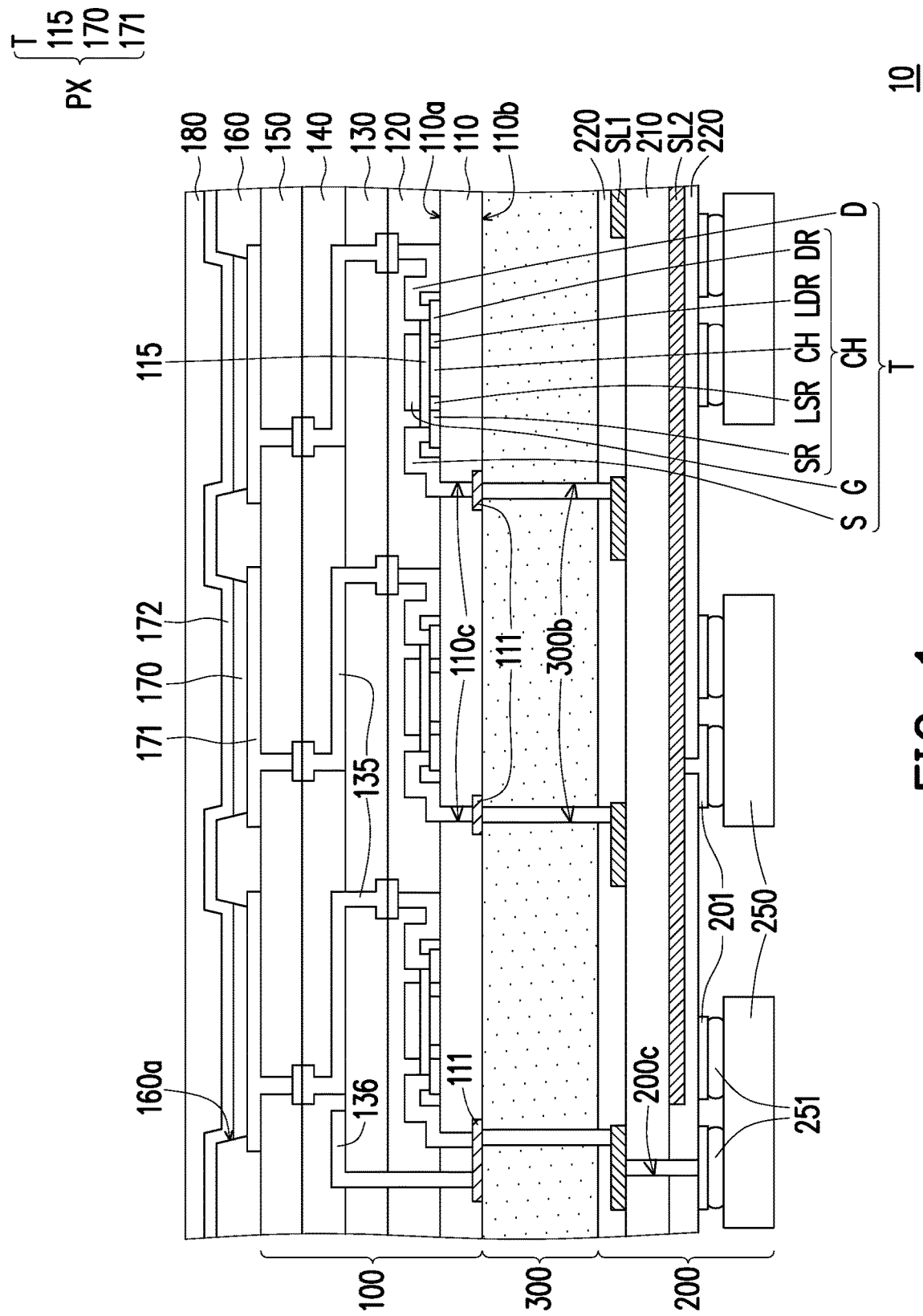
FIG. 1 is a schematic cross-sectional view of a flexible display according to the first embodiment of the disclosure.

The usages of "approximately", "similar to", "essentially" or "substantially" indicated throughout the specification include the indicated value and an average value within an acceptable deviation range of a certain value confirmed by people skilled in the art, with a certain amount of the discussed measurement and measurement-related deviation (that is, the limitation of measurement system) taken into consideration. For example, the term "approximately" may indicate to be within one or more standard deviations of the indicated value, such as being within ±30%, ±20%, ±15%, ±10%, or ±5%. Furthermore, the usages of "approximately", "similar to", "essentially" or "substantially" indicated throughout the specification may refer to a more acceptable deviation scope or standard deviation depending on measurement properties, cutting properties, or other properties, and all properties are not necessarily applied with one standard deviation.

In the drawings, for clarity, the thickness of layers, films, plates, areas, etc. are magnified. It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. For example, "to connect" indicated in the specification may indicate to physically and/or electrically connect. Furthermore, "to electrically connect" may also be used when other elements exist between two elements.

Moreover, relative terms such as "below" or "bottom" and "above" or "top" may serve to describe the relation between one element and another element in the specification according to the illustration of the drawings. It should also be understood that the relative terms are intended to include different orientations of a device in addition to the orientation shown in the drawings. For example, if a device in the accompanying drawings is flipped, an element described as being on the "lower" side of other elements shall be re-orientated to be on the "upper" side of other elements. Thus, the exemplary term "lower" may cover the orientations of "upper" and "lower", depending on the specific orientations of the accompanying drawings. Similarly, if a device in the accompanying drawings is flipped, an element described as being "below" other elements shall be re-orientated to be "above" other elements. Thus, the exemplary term "above" or "below" may cover the orientations of above and below.

Exemplary embodiments are described with cross-sectional views of schematic illustrations of ideal embodiments. Thus, shape alterations due to, for example, manufacturing techniques and/or tolerances can be expected, and the embodiments described herein should not be construed to be limited to the particular shapes of the regions as illustrated herein but include shape deviations due to, for example, manufacturing. For example, regions shown or described as being flat may generally have rough and/or non-linear features. Furthermore, the acute angles shown may be round. Therefore, the regions illustrated in the drawings are only schematic representations and are not intended to illustrate the exact shapes of the regions or to limit the scope of the claims.

References of the exemplary embodiments of the disclosure are to be made in detail. Examples of the exemplary embodiments are illustrated in the accompanying drawings. When applicable, the same reference numerals in the drawings and the descriptions indicate the same or similar parts. In addition, the number of components illustrated in the drawings is for illustrative purposes only, and the disclosure is not limited to the contents disclosed by the drawings.

Figure 2:
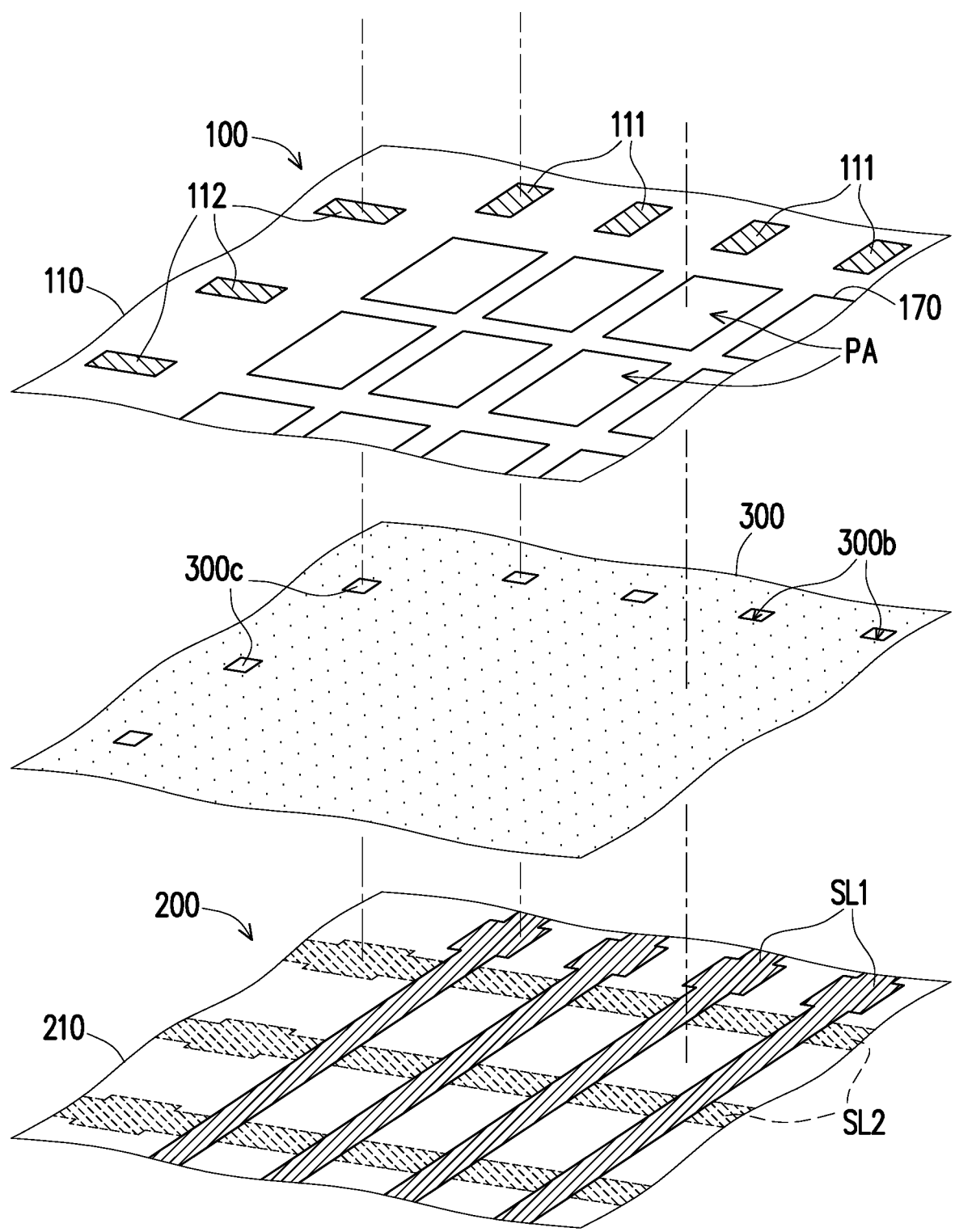
FIG. 2 is a schematic top view of the flexible circuit board, the adhesive layer, and the pixel circuit layer of FIG. 1.

FIG. 1 is a schematic cross-sectional view of a flexible display according to the first embodiment of the disclosure. FIG. 2 is a schematic top view of the flexible circuit board, the adhesive layer, and the pixel circuit layer of FIG. 1. It should be noted that, for a clear presentation, the flexible circuit board 200 of FIG. 2 omits the illustration of the protective layer 220, the fourth conductive through holes 200c, the conductors 251 and the driving chips 250 of FIG. 1, and the pixel circuit layer 100 of FIG. 2 only shows the buffer layer 110, the light emitting patterns 170, the first pads 111, and the second pads 112 of FIG. 1.

In the embodiment, a flexible display 10 may be a self-emitting display, and the self-emitting display includes, for example, an organic light emitting diode (OLED) display, a micro light emitting diode (micro-LED) display, or a mini light emitting diode (mini-LED) display. However, in other embodiments, the flexible display may also be a non-self-emitting display, and the non-self-emitting display includes, for example, a liquid crystal display (LCD).

With reference to FIG. 1, the flexible display 10 includes a pixel circuit layer 100, a flexible circuit board 200, and an adhesive layer 300, wherein the adhesive layer 300 is connected between the pixel circuit layer 100 and the flexible circuit board 200, and the flexible circuit board 200 is electrically connected to the pixel circuit layer 100 through the adhesive layer 300. Further, the pixel circuit layer 100 includes a buffer layer 110, a plurality of pixel structures PX, and a plurality of first pads 111. The buffer layer 110 has a first surface 110a and a second surface 110b opposite to each other, and the second surface 110b faces the flexible circuit board 200. The pixel structures PX are disposed on the first surface 110a of the buffer layer 110. The first pads 111 spaced from each other are disposed on the second surface 110b of the buffer layer 110, and the first pads 111 are respectively electrically connected to the pixel structures PX. Specifically, the pixel circuit layer 100 further includes a plurality of first conductive through holes 110c embedded in the buffer layer 110, and the pixel structures PX are respectively electrically connected to the first pads 111 through the first conductive through holes 110c.

In the embodiment, based on conductivity considerations, the material of pads is generally a metal material. However, the disclosure is not limited thereto. According to other embodiments, the pads may also use other conductive materials, such as an alloy, a nitride of a metal material, an oxide of a metal material, an oxynitride of a metal material, or other suitable materials, or a stacked layer of metal materials and other conductive materials.

In addition, the adhesive layer 300 is disposed on the second surface 110b of the buffer layer 110, and an orthogonal projection of the pixel structures PX on the buffer layer 110 overlaps an orthogonal projection of the adhesive layer 300 on the buffer layer 110. That is, the pixel structures PX and the adhesive layer 300 are respectively disposed on opposite sides of the buffer layer 110. In particular, when the flexible display 10 is bent, the adhesive layer 300 connected between the buffer layer 110 and the flexible circuit board 200 receives most of the bending stress, so the tensile stress or the crushing stress received by the buffer layer 110 and the pixel structures PX disposed thereon is reduced, and their damage is avoided, whereby the bending tolerance of the flexible display 10 is improved.

Further, the pixel structures PX each include an active device T and a gate insulating layer 115, wherein the active device T includes a semiconductor pattern SC, a source S, a drain D, and a gate G, and the gate insulating layer 115 is disposed between the semiconductor pattern SC and the gate G. As shown in FIG. 1, in the embodiment, the gate G of the active device T may selectively be disposed above the semiconductor pattern SC; that is, the active device T is a top-gate thin film transistor (top-gate TFT). However, the disclosure is not limited thereto. In other embodiments, the gate G of the active device T may be disposed below the semiconductor pattern SC; that is, the active device T may also be a bottom-gate thin film transistor (bottom-gate TFT).

Further, the semiconductor pattern SC may include a source region SR, a lightly doped source region LSR, a channel region CH, a lightly doped drain region LDR, and a drain region DR, wherein the lightly doped source region LSR is located between the source region SR and the channel region CH, and the lightly doped drain region LDR is located between the channel region CH and the drain region DR, and the gate G overlaps the channel region CH of the semiconductor pattern SC, and the source S and the drain D penetrate the gate insulating layer 115 to respectively electrically connect the source region SR and the drain region DR, but the disclosure is not limited thereto. According to other embodiments, the semiconductor pattern SC may include only the source region SR, the channel region CH, and the drain region DR. In the embodiment, the semiconductor pattern SC, the gate G, the source S, the drain D, and the gate insulating layer 115 may be respectively implemented by any semiconductor pattern, any gate, any source, any drain, and any gate insulating layer for a pixel circuit layer known to people skilled in the art, and the semiconductor pattern SC, the gate G, the source S, the drain D, and the gate insulating layer 115 may be respectively formed by any method known to people skilled in the art.

In the embodiment, the pixel circuit layer 100 may further include an insulating layer 120, an insulating layer 130, an insulating layer 140, an insulating layer 150, a plurality of first connection patterns 135, and a second connection pattern 136. The insulating layer 120, the insulating layer 130, the insulating layer 140, and the insulating layer 150 are sequentially stacked on the active devices T and the buffer layer 110. For example, the first connection patterns 135 may be disposed on the insulating layer 120, the insulating layer 130, the insulating layer 140, and the insulating layer 150, and each of the first connection patterns 135 is electrically connected to the drain D of the corresponding active device T. In addition, the second connection pattern 136 may be disposed on the buffer layer 110, the insulating layer 120, the insulating layer 130, and the insulating layer 140 and be electrically connected between the corresponding first pads 111 and the circuit wirings, wherein the circuit wirings include, for example, a power supply wiring electrically connecting the pixel structures PX or a signal wiring of the gate driving circuit, but the disclosure is not limited thereto.

For example, the flexible display 10 may also selectively include a plurality of pixel areas PA, an isolation structure layer 160, and a common electrode 172. The pixel areas PA may be arranged on the buffer layer 110 in an array, and the pixel structures PX are respectively disposed in the pixel areas PA. Further, the pixel structures PX may also selectively include a plurality of light emitting patterns 170 and a plurality of pixel electrodes 171. The pixel electrodes 171 are disposed on the insulating layer 150 and respectively penetrate the insulating layer 150 to electrically connect the corresponding first connection pattern 135. The isolation structure layer 160 covers a portion of a surface of the insulating layer 150 and a portion of a surface of each of the pixel electrodes 171 and has a plurality of grooves 160a aligned with the pixel areas PA, wherein each of the light emitting patterns 170 may be disposed in the corresponding groove 160a. The common electrode 172 may selectively cover the isolation structure layer 160 and be filled in the grooves 160a to electrically connect the light emitting patterns 170.

In the embodiment, the material of the light emitting patterns 170 may include an organic electroluminescent material, a fluorescent organic electroluminescent material, an inorganic electroluminescent material, or a combination of at least two of the above materials, but the disclosure is not limited thereto. In addition, the pixel electrodes 171 and the common electrode 172 are, for example, light transmissive electrodes, and the light transmissive electrodes include metal oxides, such as an indium tin oxide, an indium zinc oxide, an aluminum tin oxide, an aluminum zinc oxide, or other suitable oxides, or a stacked layer of at least two of the foregoing. However, the disclosure is not limited thereto. According to other embodiments, the pixel electrodes 171 may be reflective electrodes, and the reflective electrodes include a metal, an alloy, a nitride of a metal material, an oxide of a metal material, an oxynitride of a metal material, or other suitable materials, or a stacked layer of metal materials and other conductive materials. In the embodiment, the material of the isolation structure layer 160 includes an inorganic material (such as silicon oxide, silicon nitride, silicon oxynitride, other suitable materials, or a stacked layer of at least two of the above materials).

Further, the flexible circuit board 200 has a flexible substrate 210 and a plurality of first signal lines SL1. The first signal lines SL1 are disposed in juxtaposition on the flexible substrate 210 and respectively electrically connected to the first pads 111 of the pixel circuit layer 100. In the embodiment, the flexible circuit board 200 may also selectively have a plurality of second signal lines SL2, and the pixel circuit layer 100 may also selectively include a plurality of second pads 112 (as shown in FIG. 2), and the second pads 112 are respectively electrically connected to the second signal lines SL2, but the disclosure is not limited thereto.

In particular, the first signal lines SL1 and the second signal lines SL2 may be respectively disposed on opposite sides of the flexible substrate 210 and be (electrically) isolated from each other. That is, the flexible circuit board 200 may be a circuit board having wirings on both sides, but the disclosure is not limited thereto. For example, an orthogonal projection of the first signal lines SL1 on the flexible substrate 210 may intersect with an orthogonal projection of the second signal lines SL2 on the flexible substrate 210 (as shown in FIG. 2), but the disclosure is not limited thereto. In particular, the first signal lines SL1 and the second signal lines SL2 may define the pixel areas PA of the flexible display 10.

In the embodiment, the first signal lines SL1 are, for example, data lines, and the second signal lines SL2 are, for example, scan lines, and the source S and the gate G of each active device T are respectively electrically connected to one corresponding first signal line SL1 and one corresponding second signal line SL2. That is, the first signal lines SL1 and the second signal lines SL2 located on the flexible circuit board 200 may be used to enable the active devices T located on the pixel circuit layer 100, electrically connect the pixel electrodes 171 of the active devices T, and drive the light emitting patterns 170 interposed between the pixel electrodes 171 and the common electrode 172 to emit a visible beam. However, the disclosure is not limited thereto. According to other embodiments, the first signal lines SL1 may be scan lines and be respectively electrically connected to the gate G of the corresponding active device T; the second signal lines SL2 may be data lines and be respectively electrically connected to the source S of the corresponding active device T.

In addition, the ductility of the first signal lines SL1 and the second signal lines SL2 on the flexible circuit board 200 may selectively be higher than the ductility of conductive patterns of the pixel structures PX, wherein the conductive patterns are, for example, the source S, the drain D, the gate G, or the first connection patterns 135 connected between the pixel electrodes 171 and the active devices T. In addition, in some embodiments, the consistency of the first signal lines SL1 and the second signal lines SL2 on the flexible circuit board 200 may selectively be greater than the consistency of the conductive patterns of the pixel structures PX. For example, the signal lines on the flexible circuit board 200 (such as the first signal lines SL1 and the second signal lines SL2) may be manufactured by being exposed and developed on a conductive material layer (such as copper foil) formed by calendering a metal block material. The conductive material layer formed by calendering a metal raw material may have better ductility or material consistency than a conductive material layer obtained by vapor deposition of the raw material in the thin film process. Accordingly, when the flexible display 10 is bent, the first signal lines SL1 and the second signal lines SL2 disposed on the flexible circuit board 200 are not easily broken due to higher ductility (or larger material consistency), which helps improving the bending tolerance of the flexible circuit board 200 while ensuring the electrical performance of the flexible display 10 in a bent state.

Further, in the embodiment, the material of the adhesive layer 300 includes, for example, an optical clear adhesive (OCA), a pressure sensitive adhesive (PSA), or other suitable adhesive materials, and the adhesive layer 300 may selectively have a plurality of second conductive through holes 300b and a plurality of third conductive through holes 300c, wherein the first pads 111 may be respectively electrically connected to the corresponding first signal line SL1 on the flexible circuit board 200 through the corresponding second conductive through hole 300b; correspondingly, the second signal lines SL2 may be respectively electrically connected to the corresponding second pad 112 (as shown in FIG. 2) on the pixel circuit layer 100 through the corresponding third conductive through hole 300c (as shown in FIG. 2) in the adhesive layer 300. However, the disclosure is not limited thereto. In other embodiments, the adhesive layer 300 may be an anisotropic conductive film (ACF), and the first pads 111 of the pixel circuit layer 100 may be respectively electrically connected to the first signal lines SL1 of the flexible circuit board 200 directly through the adhesive layer 300. That is, the adhesive layer 300 is not necessarily provided with conductive through holes.

Further, the flexible circuit board 200 may selectively have a protective layer 220, a plurality of pads 201 and a plurality of driving chips 250. In the embodiment, the number of the protective layer 220 may be two, and the protective layers 220 respectively cover the first signal lines SL1 and the second signal lines SL2 on opposite sides of the flexible substrate 210. It should be noted that the number of the protective layer 220 may be adjusted according to the circuit layout of the flexible circuit board 200. For example, the number of the protective layer 220 may be one for a circuit board having wiring only on one side thereof. Further, the pads 201 may be disposed on the protective layer 220 covering the second signal lines SL2, and a portion of the pads 201 are respectively electrically connected to one corresponding first signal line SL1 through a corresponding fourth conductive through hole 200c disposed penetrating the flexible substrate 210 and the protective layer 220; correspondingly, the other portion of the pads 201 respectively penetrate the protective layer 220 to be electrically connected to one corresponding second signal line SL2. However, the disclosure is not limited thereto.

For example, each of the driving chips 250 may be (electrically) connected to two corresponding pads 201 through two conductors 251, wherein the conductors 251 are, for example, solder pastes, but the disclosure is not limited thereto. In some embodiments, the bonding of the driving chips 250 to the pads 201 may be implemented by any method known to people skilled in the art. In the embodiment, the flexible display 10 may also selectively include an encapsulation layer 180. The encapsulation layer 180 is disposed to cover the common electrode 172, and the material of the encapsulation layer 180 may include silicon nitride, aluminum oxide, aluminum carbonitride, silicon oxynitride, acrylic resin, hexamethyldisiloxane (HMDSO), or glass, but the disclosure is not limited thereto.

Other embodiments are described below to explain the disclosure in detail, and the same components will be denoted by the same reference numerals, and the description of the same technical content will be omitted. For the description of the omitted part, reference may be made to the above embodiment, and details are not described in the following embodiments.

Figure 3:
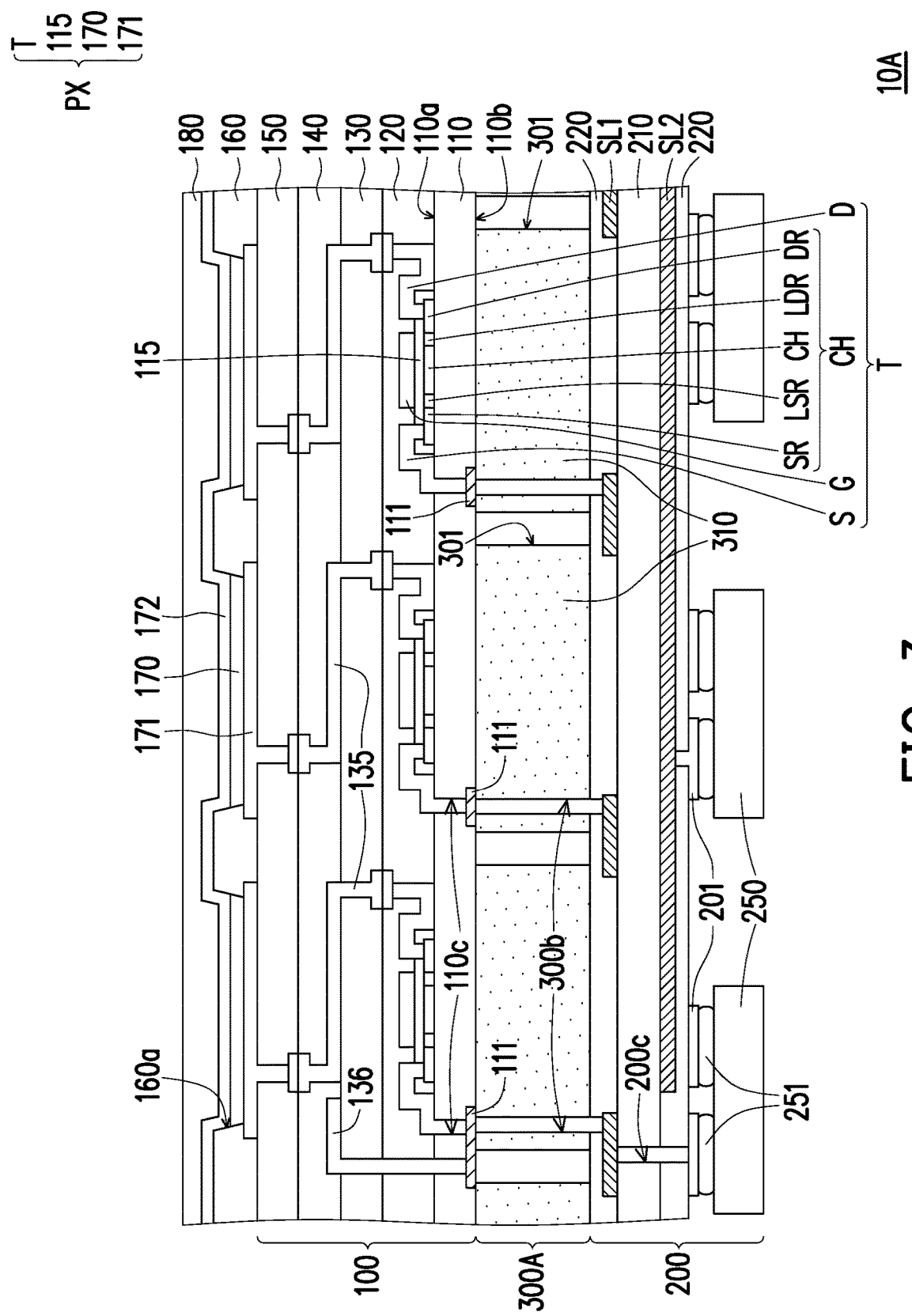
FIG. 3 is a schematic cross-sectional view of a flexible display according to the second embodiment of the disclosure.
Figure 4:
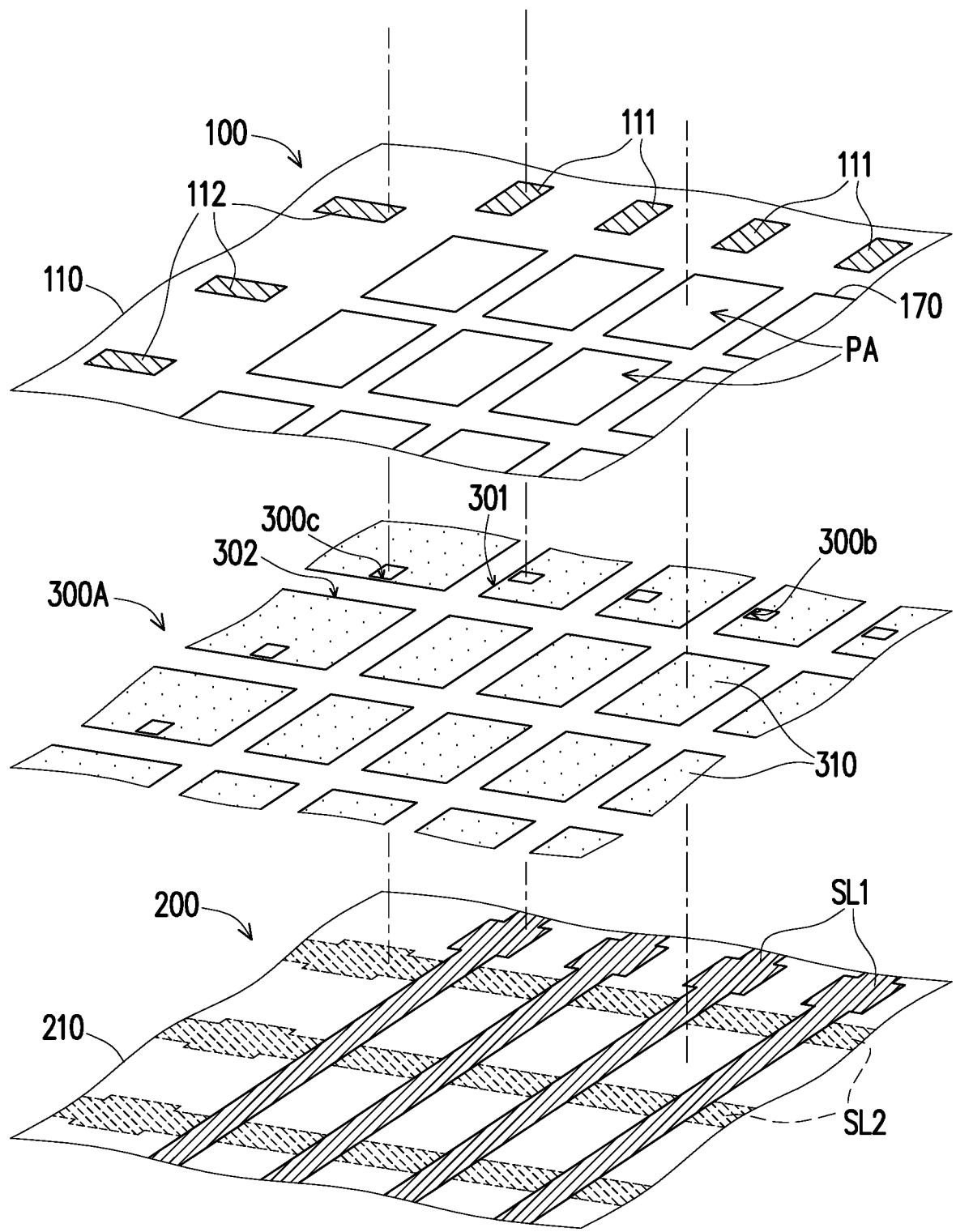
FIG. 4 is a schematic top view of the flexible circuit board, the adhesive layer, and the pixel circuit layer of FIG. 3.

FIG. 3 is a schematic cross-sectional view of a flexible display according to the second embodiment of the disclosure. FIG. 4 is a schematic top view of the flexible circuit board, the adhesive layer, and the pixel circuit layer of FIG. 3. It should be noted that, for a clear presentation, the flexible circuit board 200 of FIG. 4 omits the illustration of the protective layer 220, the fourth conductive through holes 200c, the conductors 251 and the driving chips 250 of FIG. 3, and the pixel circuit layer 100 of FIG. 4 only shows the buffer layer 110, the light emitting patterns 170, the first pads 111, and the second pads 112 of FIG. 3.

With reference to FIGS. 3 and 4, the difference between a flexible display 10A of this embodiment and the flexible display 10 of the previous embodiment lies in the structural design and disposition of an adhesive layer 300A of the flexible display 10A. Specifically, the adhesive layer 300A of the flexible display 10A has a plurality of first grooves 301, and an orthogonal projection of each of the first grooves 301 on the buffer layer 110 is located between two orthogonal projections of two adjacent first pads 111 on the buffer layer 110. Further, the adhesive layer 300A may also selectively have a plurality of second grooves 302, and the second grooves 302 are disposed intersecting with the first grooves 301.

It should be noted that the first grooves 301 and the second grooves 302 may define a plurality of island-shaped blocks 310 of the adhesive layer 300A, and the pixel structures PX of the pixel circuit layer 100 are respectively disposed above the island-shaped blocks 310 of the adhesive layer 300A, as shown in FIG. 3. When the flexible display 10A is bent, the adhesive layer 300A having the island-shaped blocks 310 can generate a larger bending strain, so the bending stress (such as the tensile stress or the crushing stress) received by the pixel structures PX disposed adjacent to and above the island-shaped blocks 310 is reduced and their damage is avoided, which helps ensuring the electrical performance of the pixel structures PX in a bent state, whereby the bending tolerance of the flexible display 10A is improved.

Figure 5:
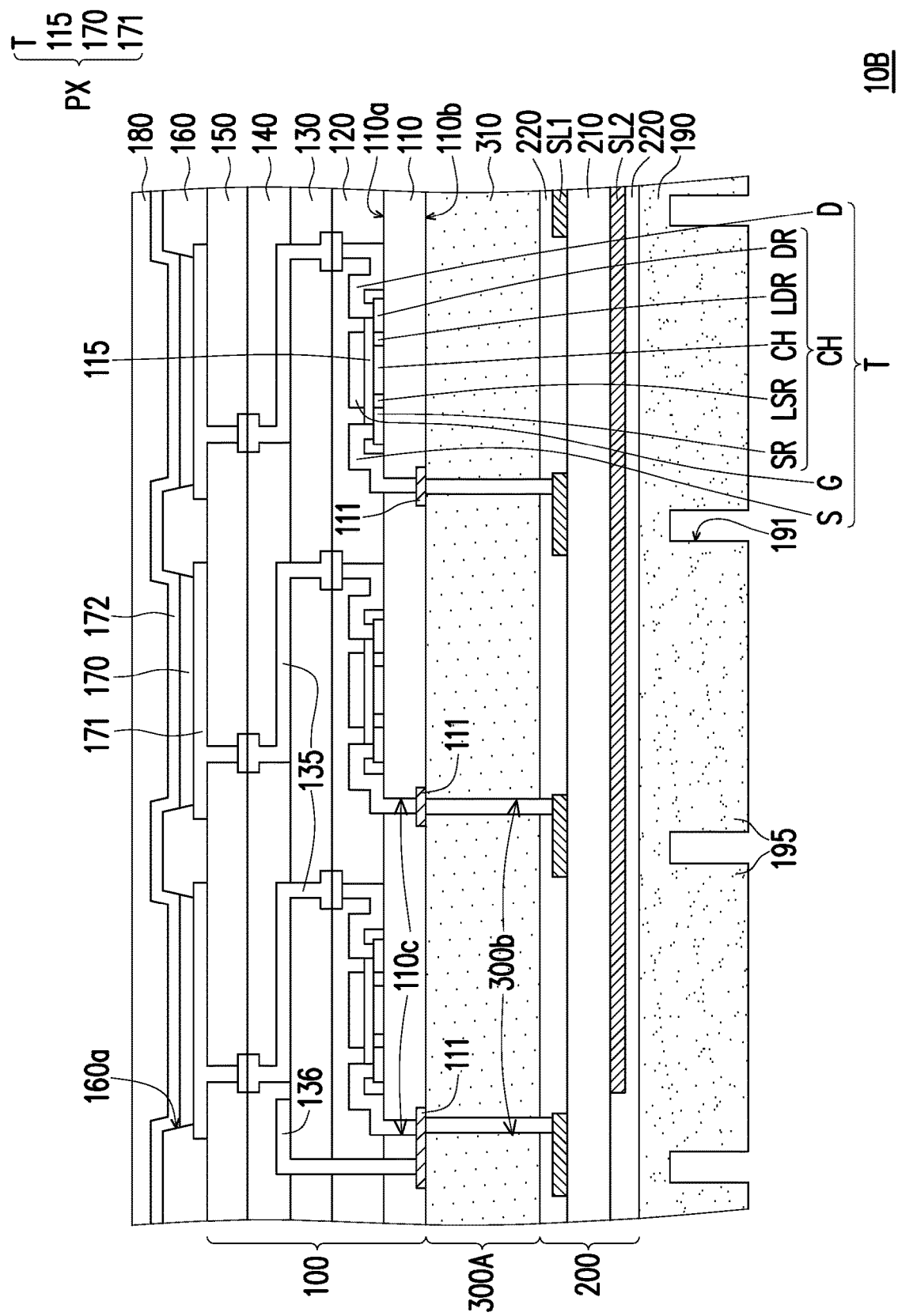
FIG. 5 is a schematic cross-sectional view of a flexible display according to the third embodiment of the disclosure.
Figure 6:
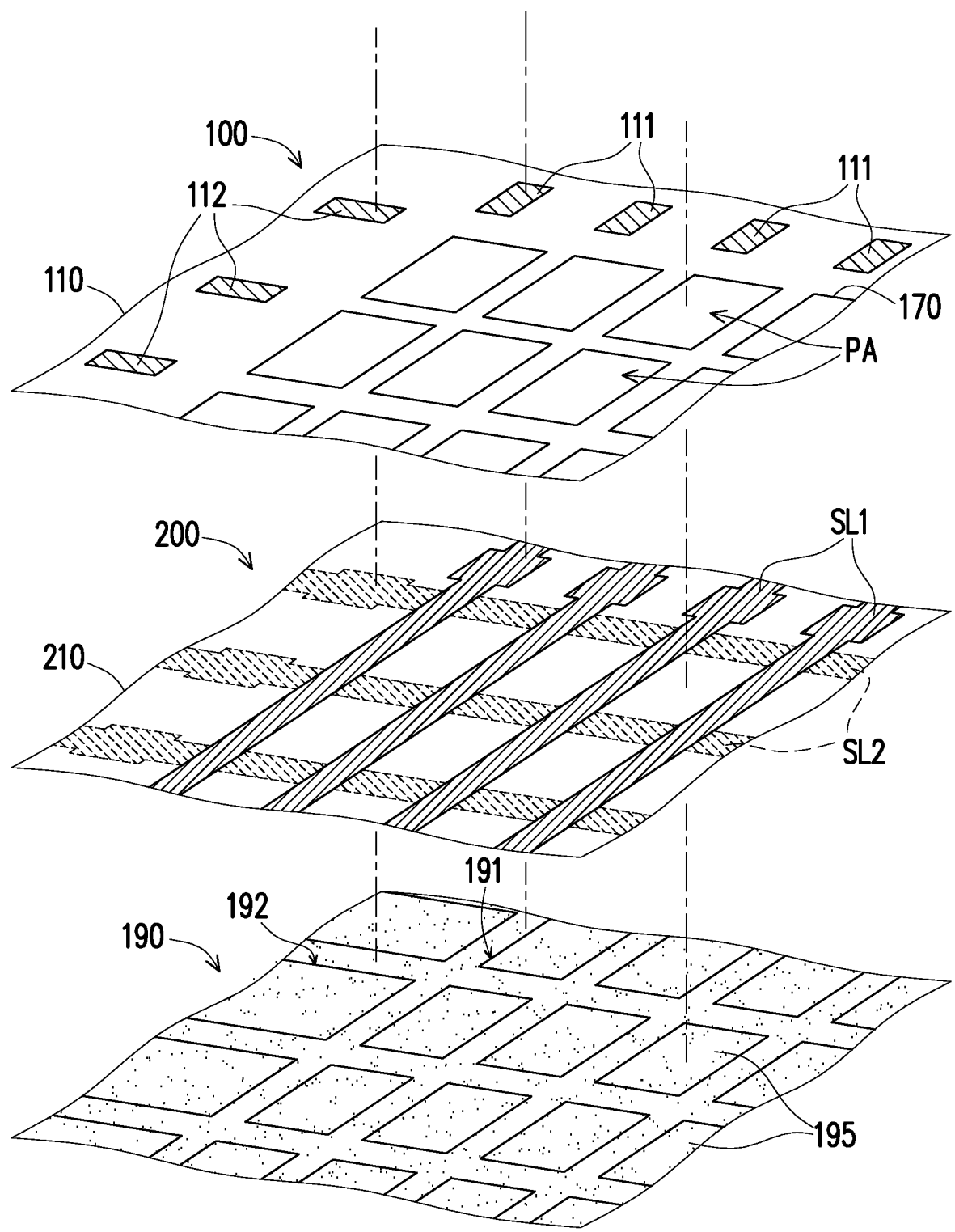
FIG. 6 is a schematic top view of the protective layer, the flexible circuit board, and the pixel circuit layer of FIG. 5.

FIG. 5 is a schematic cross-sectional view of a flexible display according to the third embodiment of the disclosure. FIG. 6 is a schematic top view of the protective layer, the flexible circuit board, and the pixel circuit layer of FIG. 5. It should be noted that, for a clear presentation, the flexible circuit board 200 of FIG. 6 omits the illustration of the protective layer 220 of FIG. 5, and the pixel circuit layer 100 of FIG. 6 only shows the buffer layer 110, the light emitting patterns 170, the first pads 111, and the second pads 112 of FIG. 5.

With reference to FIGS. 5 and 6, the difference between a flexible display 10B of this embodiment and the flexible display 10 of the previous embodiment lies in that the flexible display 10B further includes a protective layer 190. In the embodiment, the protective layer 190 is disposed on a side of the flexible circuit board 200 away from the adhesive layer 300; that is, the flexible circuit board 200 is located between the adhesive layer 300 and the protective layer 190. Specifically, the protective layer 190 has a plurality of third grooves 191, and an orthogonal projection of each of the third grooves 191 on the buffer layer 110 is located between two orthogonal projections of two adjacent first pads 111 on the buffer layer 110. Further, the protective layer 190 may also selectively have a plurality of fourth grooves 192, and the fourth grooves 192 are disposed intersecting with the third grooves 191.

It should be noted that the third grooves 191 and the fourth grooves 192 may define a plurality of bumps 195 of the protective layer 190, and the pixel structures PX of the pixel circuit layer 100 are respectively disposed above the bumps 195 of the protective layer 190, as shown in FIG. 5. When the flexible display 10B is bent, the protective layer 190 having the bumps 195 can generate a larger bending strain, so the bending stress (such as the tensile stress or the crushing stress) received by the pixel structures PX disposed above the bumps 195 is reduced and their damage is avoided, which helps ensuring the electrical performance of the pixel structures PX in a bent state, whereby the bending tolerance of the flexible display 10B is improved.

Figure 7:
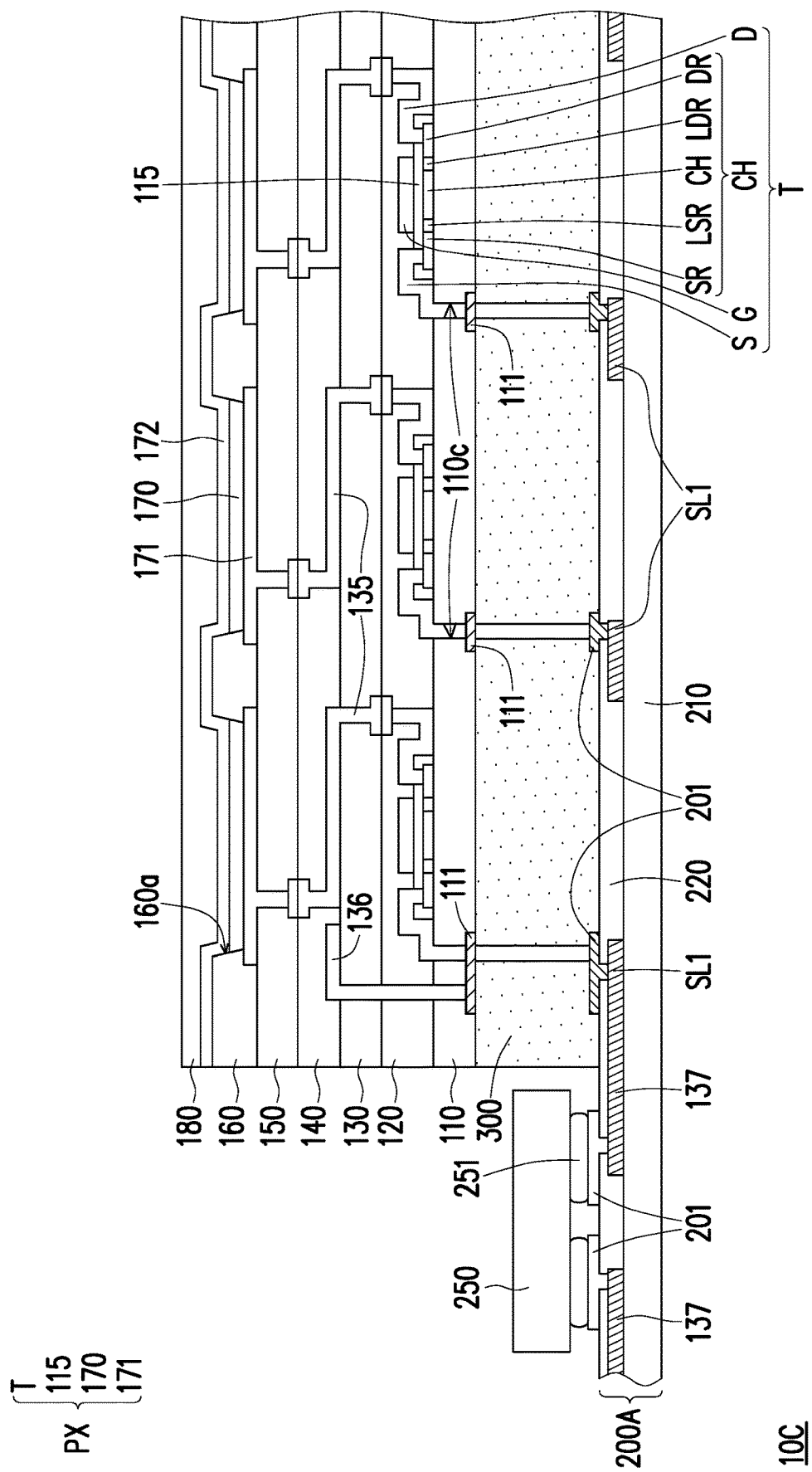
FIG. 7 is a schematic cross-sectional view of a flexible display according to the fourth embodiment of the disclosure.

FIG. 7 is a schematic cross-sectional view of a flexible display according to the fourth embodiment of the disclosure. With reference to FIG. 7, the difference between a flexible display 10C of this embodiment and the flexible display 10 of the previous embodiment lies in that a flexible circuit board 200A of the flexible display 10C is a circuit board having wiring on one side and that the flexible circuit board 200A further has third connection patterns 137 electrically connected between the driving chips 250 and the first signal lines SL1. In the embodiment, the pads 201 of the flexible circuit board 200A may be disposed on a side of the flexible substrate 210 facing the adhesive layer 300, wherein a portion of the pads 201 respectively penetrate the protective layer 220 to be electrically connected to one corresponding first signal line SL1, and the other portion of the pads 201 respectively penetrate the protective layer 220 to be electrically connected to one corresponding third connection pattern 137.

Figure 8:
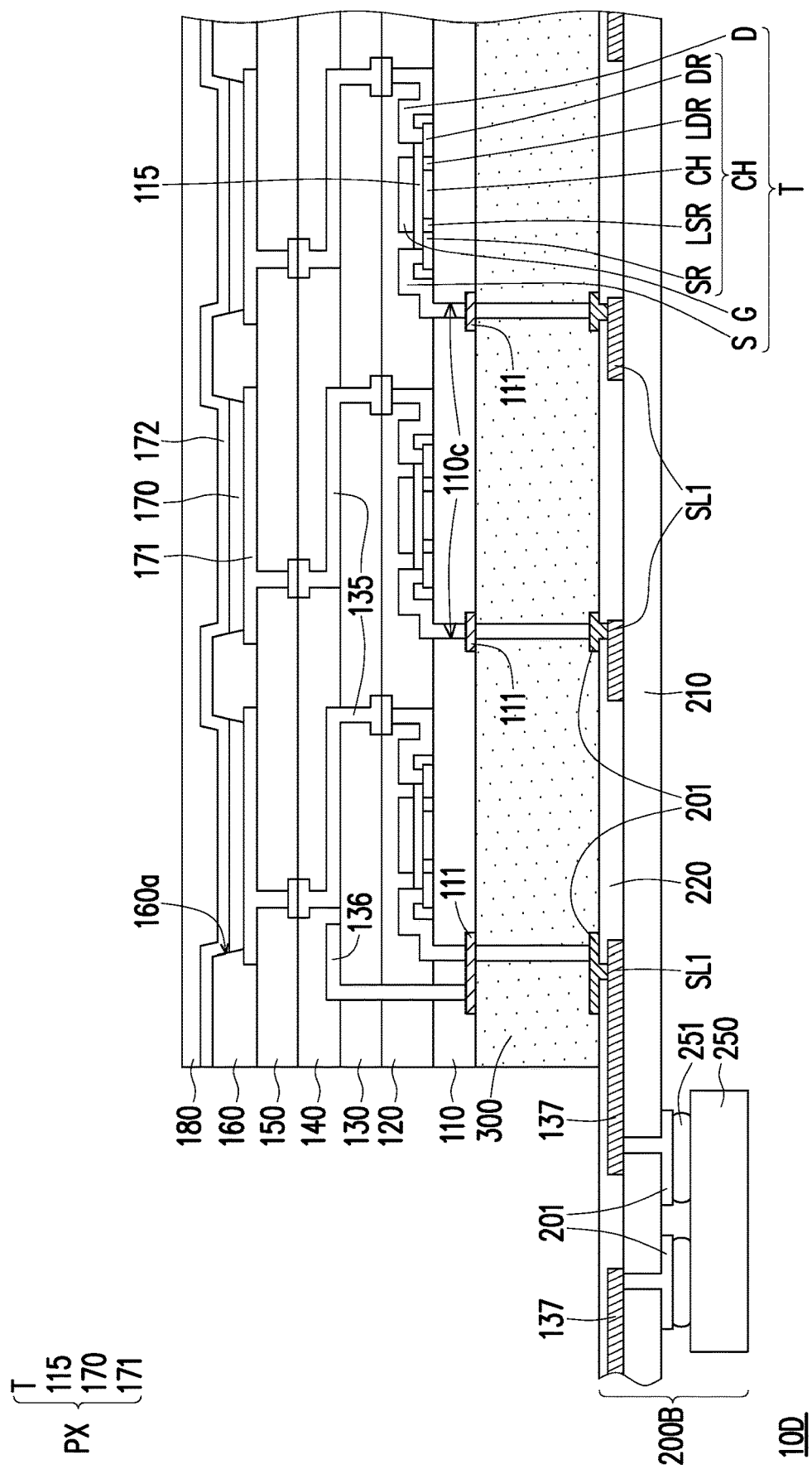
FIG. 8 is a schematic cross-sectional view of a flexible display according to the fifth embodiment of the disclosure.

FIG. 8 is a schematic cross-sectional view of a flexible display according to the fifth embodiment of the disclosure. With reference to FIG. 8, the difference between a flexible display 10D of this embodiment and the flexible display 10C of FIG. 7 lies in that a portion of the pads 201 and the driving chips 250 of a flexible circuit board 200B are disposed on the side of the flexible substrate 210 away from the adhesive layer 300. In detail, a portion of the pads 201 electrically connected to the first pads 111 respectively penetrate the protective layer 220 to be electrically connected to one corresponding first signal line SL1, and the other portion of the pads 201 electrically connected to the driving chips 250 respectively penetrate the flexible substrate 210 to be electrically connected to one corresponding third connection pattern 137.

In summary, when the flexible display according to an embodiment of the disclosure is bent, the adhesive layer connected between the flexible circuit board and the buffer layer provided with the pixel structures receives most of the bending stress, which can reduce the risk of breakage of adjacent film layers under the tensile stress or the crushing stress and can help improving the bending tolerance of the flexible display. Further, the first signal lines for driving the pixel structures are disposed on the flexible circuit board, which can increase the tensile strain of the first signal lines, thereby ensuring the electrical performance of the pixel structures when the flexible display is bent.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:
1. A flexible device, comprising:
a buffer layer having a first surface and a second surface opposite to each other;
a plurality of pixel structures disposed on the first surface of the buffer layer;
a plurality of first pads disposed on the second surface of the buffer layer and spaced from each other;
a plurality of first conductive through holes embedded in the buffer layer, wherein the plurality of first pads are respectively electrically connected to the plurality of pixel structures through the plurality of first conductive through holes;
a flexible circuit board having a plurality of first signal lines; and an adhesive layer disposed between the second surface of the buffer layer and the flexible circuit board, an orthogonal projection of the adhesive layer on the buffer layer overlapping an orthogonal projection of the plurality of pixel structures on the buffer layer, wherein the plurality of first pads are electrically connected to the plurality of first signal lines of the flexible circuit board.

2. The flexible display according to claim 1, wherein the adhesive layer is an anisotropic conductive adhesive, and the plurality of first pads are electrically connected to the plurality of first signal lines of the flexible circuit board through the adhesive layer.

3. The flexible display according to claim 1, further comprising:
   a plurality of second conductive through holes embedded in the adhesive layer, wherein the plurality of first pads are respectively electrically connected to the plurality of first signal lines of the flexible circuit board through the plurality of second conductive through holes.

4. The flexible display according to claim 1, wherein the flexible circuit board further has a plurality of second signal lines disposed intersecting with the plurality of first signal lines, the plurality of second signal lines are electrically connected to the plurality of pixel structures, the plurality of first signal lines of the flexible circuit board and the plurality of second signal lines define a plurality of pixel areas, and the plurality of pixel structures are respectively disposed in the plurality of pixel areas.

5. The flexible display according to claim 4, wherein the flexible circuit board further has:
   a flexible substrate, wherein the plurality of first signal lines and the plurality of second signal lines are respectively disposed on opposite sides of the flexible substrate.

6. The flexible display according to claim 1, wherein the adhesive layer has a plurality of first grooves, and an orthogonal projection of each of the plurality of first grooves is located between two orthogonal projections of any two adjacent first pads among the plurality of first pads.

7. The flexible display according to claim 6, wherein the adhesive layer further has a plurality of second grooves intersecting with the plurality of first grooves, the plurality of first grooves and the plurality of second grooves define a plurality of island-shaped blocks of the adhesive layer, and the plurality of pixel structures are respectively disposed above the plurality of island-shaped blocks of the adhesive layer.

8. The flexible display according to claim 1, further comprising:
   a protective layer, wherein the flexible circuit board is located between the adhesive layer and the protective layer, the protective layer has a plurality of third grooves, and an orthogonal projection of each of the plurality of third grooves is located between two orthogonal projections of any two adjacent first pads among the plurality of first pads.

9. The flexible display according to claim 8, wherein the protective layer further has a plurality of fourth grooves intersecting with the plurality of third grooves, the plurality of third grooves and the plurality of fourth grooves define a plurality of bumps of the protective layer, and the plurality of pixel structures are respectively disposed above the plurality of bumps of the protective layer.

10. The flexible display according to claim 1, wherein the ductility of one of the plurality of first signal lines of the flexible circuit board is higher than the ductility of a conductive pattern of one of the plurality of pixel structures.

11. The flexible display according to claim 1, wherein the consistency of one of the plurality of first signal lines of the flexible circuit board is greater than the consistency of a conductive pattern of one of the plurality of pixel structures.

* * * * *